United States Patent
Mao et al.

(10) Patent No.: US 8,143,696 B2
(45) Date of Patent: Mar. 27, 2012

(54) INTEGRATED CIRCUIT INDUCTORS WITH REDUCED MAGNETIC COUPLING

(75) Inventors: Weiwei Mao, Macungie, PA (US); Shahriar Moinian, New Providence, NJ (US); Kenneth Wade Paist, Spring City, PA (US); William B. Wilson, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 310 days.

(21) Appl. No.: 12/516,301

(22) PCT Filed: Mar. 18, 2009

(86) PCT No.: PCT/US2009/037529
§ 371 (c)(1),
(2), (4) Date: May 26, 2009

(87) PCT Pub. No.: WO2010/107430
PCT Pub. Date: Sep. 23, 2010

(65) Prior Publication Data
US 2010/0314713 A1    Dec. 16, 2010

(51) Int. Cl.
*H01L 27/08* (2006.01)
(52) U.S. Cl. ......... 257/531; 257/528; 438/381; 361/782
(58) Field of Classification Search ........... 257/E21.022, 257/531, 528, 904; 361/782, 811, 821, 760; 438/381
See application file for complete search history.

(56) References Cited

U.S. PATENT DOCUMENTS
7,411,479 B2 *  8/2008  Baarman et al. ............... 336/198
2007/0236319 A1 * 10/2007  Hsu et al. ...................... 336/200

FOREIGN PATENT DOCUMENTS
JP           09-045866          2/1997
WO  PCT/US2009/037529       1/2010
* cited by examiner

*Primary Examiner* — Ha Tran T Nguyen
*Assistant Examiner* — Thanh Y Tran
(74) *Attorney, Agent, or Firm* — Ryan, Mason & Lewis, LLP

(57) ABSTRACT

An IC inductor structure is provided which includes a first inductor element formed on a semiconductor substrate and at least a second inductor element formed on the semiconductor substrate proximate the first inductor element. The first inductor element has a first effective magnetic field direction associated therewith, and the second inductor element has a second effective magnetic field direction associated therewith. The first and second inductor elements are oriented relative to one another so as to create a non-zero angle between the first and second effective magnetic field directions.

20 Claims, 3 Drawing Sheets

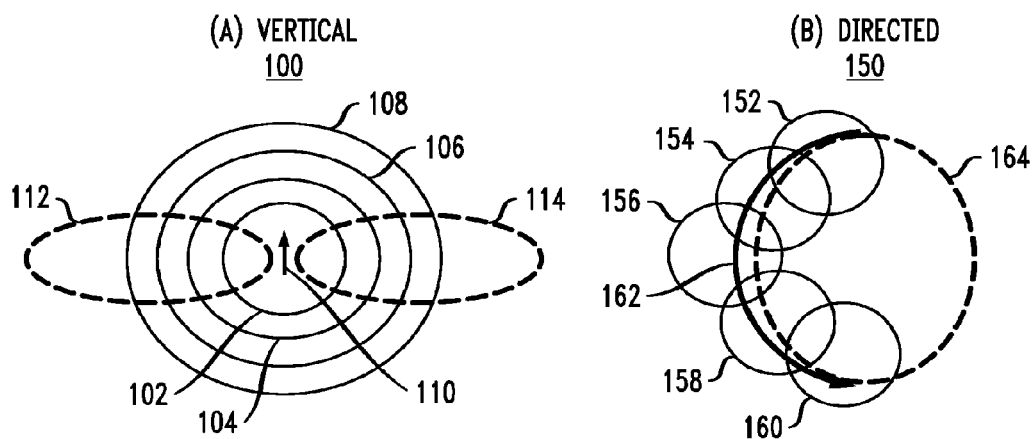
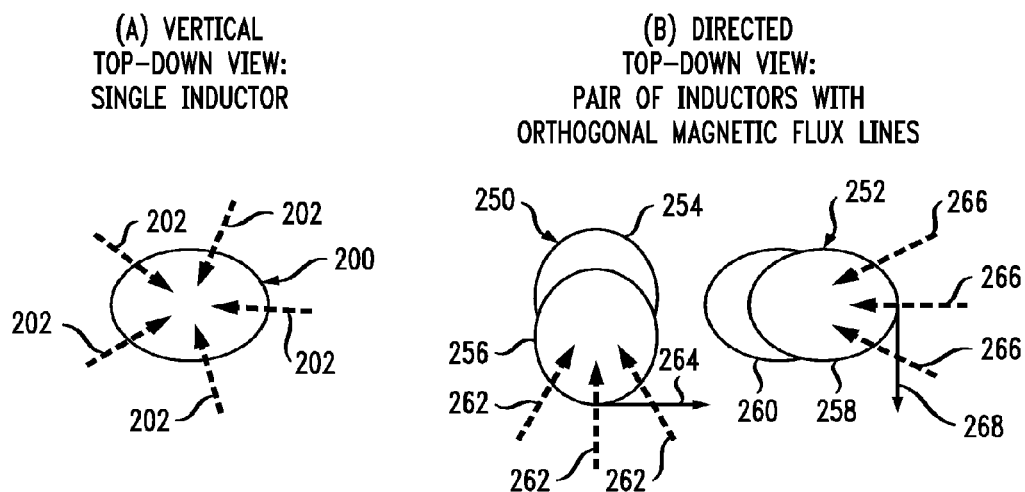

INTEGRATED CIRCUIT INDUCTORS WITH REDUCED MAGNETIC COUPLING

FIELD OF THE INVENTION

The present invention relates generally to the electrical, electronic, and computer arts, and more particularly relates to integrated circuit (IC) inductors.

BACKGROUND OF THE INVENTION

Inductors are used in a wide range of applications, including, for example, communication systems, signal processing systems, filters, tank circuits, etc. As these electronic systems have become more integrated and scaled down, effectively, systems on a chip (SOC), circuit designers have sought to eliminate the use of large auxiliary components, such as inductors. When unable to eliminate inductors in their designs, engineers have sought to reduce the size of the inductors they do utilize so as to facilitate the inclusion of such inductors on-chip.

One approach to integrating inductors on-chip is to employ simulated inductors rather than discrete inductors. Simulating inductors using active circuits, which are easily miniaturized, is one approach to eliminating the use of actual inductors in electronic systems. Unfortunately, simulated inductor circuits frequently exhibit high parasitic effects, and often generate significantly more noise than circuits constructed using discrete inductors, and are therefore undesirable.

Inductors can be miniaturized for use in compact communication systems, such as cell phones, modems, etc., by fabricating spiral inductors on the same substrate as the integrated circuit (IC) to which they are coupled using IC manufacturing techniques. For example, most conventional implementations of inductance-capacitance (LC) tank oscillators utilize symmetrically designed integrated spiral inductors which are designed to optimize the performance of the individual inductors independent of any coupling properties. In some applications, such as, for example, SERDES (serializer/deserializer) and integrated radios, if there are two transmit and/or receive channels operating at slightly different frequencies (e.g., 400 parts-per-million (ppm) apart), then the inductors can couple magnetically and create unwanted interference signals. Moreover, spiral inductors take up a disproportionately large share of the available surface area on an IC substrate.

Conventional approaches for reducing inductor coupling have either involved lowering the current in the inductor, resulting in lower magnetic flux density, or physically spacing the inductors farther apart, since the coupling mechanism decreases as a function of the square of the distance between adjacent inductors. There have also been attempts at reducing coupling through the use of grounded shields (e.g., Faraday cage) around the spiral inductors. These methods, however, only reduce electric field interfere and not magnetic coupling, which is a primary source of coupling between spiral inductors.

Accordingly, there exists a need for techniques for forming IC inductors that do not suffer from one or more of the limitations exhibited by conventional approaches.

SUMMARY OF THE INVENTION

Embodiments of the present invention meet the above-noted need by providing techniques for fainting IC inductors having directional electromagnetic emission so as to reduce magnetic coupling between such inductors when placed in close relative proximity to one another. By reducing the coupling between adjacent IC inductors, isolation, and hence performance, between multi-channel circuits, including, for example, LC oscillators, as well as other circuits and applications employing IC inductors, can be beneficially improved. Moreover, such reduced coupling between adjacent IC inductors can be achieved, in accordance with aspects of the present invention, without the need to increase physical spacing between the inductors, thereby reducing the required area and corresponding cost of the IC.

In accordance with one aspect of the invention, an IC inductor structure is provided which includes a first inductor element formed on a semiconductor substrate and at least a second inductor element formed on the semiconductor substrate proximate the first inductor element. The first inductor element has a first effective magnetic field direction associated therewith, and the second inductor element has a second effective magnetic field direction associated therewith. The first and second inductor elements are oriented relative to one another so as to create a non-zero angle between the first and second effective magnetic field directions.

In accordance with another aspect of the invention, an electronic system comprises at least one integrated circuit including at least one inductor structure. The inductor structure includes a first inductor element formed on a semiconductor substrate, the first inductor element having a first effective magnetic field direction associated therewith, and at least a second inductor element formed on the semiconductor substrate proximate the first inductor element. The second inductor element has a second effective magnetic field direction associated therewith. The first and second inductor elements are oriented relative to one another so as to create a non-zero angle between the first and second effective magnetic field directions.

In accordance with yet another aspect of the invention, a method of reducing magnetic coupling between at least two integrated circuit inductors includes the steps of: forming a first inductor element on a semiconductor substrate, the first inductor element having a first effective magnetic field direction associated therewith; and forming at least a second inductor element on the semiconductor substrate proximate the first inductor element, the second inductor element having a second effective magnetic field direction associated therewith, the first and second inductor elements being oriented relative to one another so as to create a non-zero angle between the first and second effective magnetic field directions.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only, and without limitation, wherein like reference numerals indicate similar elements throughout the several views of the drawings, and wherein:

FIGS. 1A and 1B are conceptual views of an illustrative spiral inductor and an exemplary directed inductor, respectively, according to an embodiment of the present invention;

FIGS. 2A and 2B are top-down views depicting an exemplary spiral inductor and a pair of exemplary directed inductors, respectively, according to embodiments of the present invention;

DETAILED DESCRIPTION OF THE INVENTION

Figure 3:
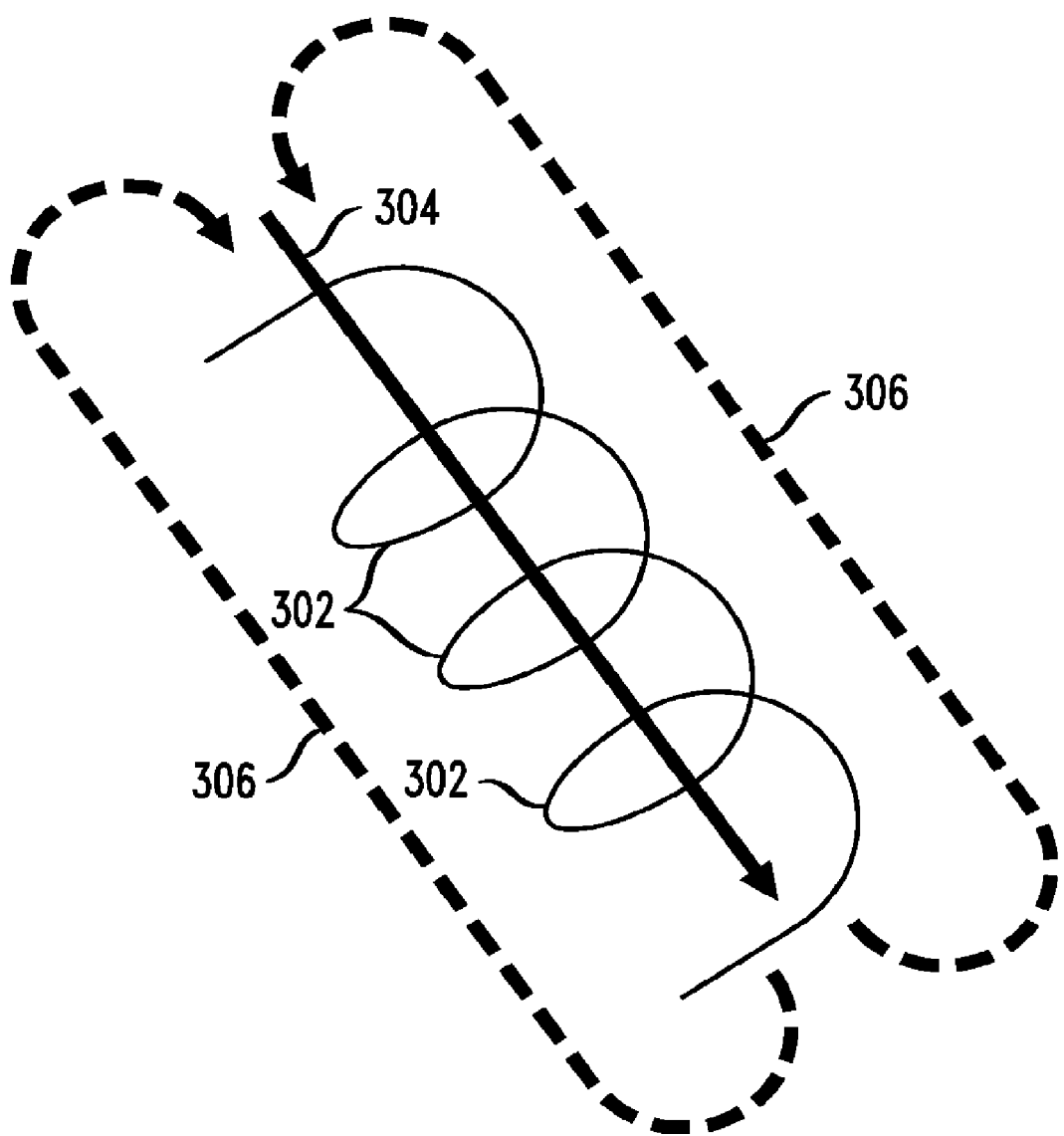
FIG. 3 is a perspective view depicting an exemplary directed inductor, according to an embodiment of the present invention.

The present invention will be described herein in the context of exemplary IC inductor structures. It is to be understood, however, that the techniques of the present invention are not limited to the IC inductor structures shown and described herein. Rather, embodiments of the invention are directed broadly to techniques for reducing magnetic coupling between two or more IC inductors when placed in close relative proximity to one another. Although preferred embodiments of the invention may be fabricated in a silicon wafer, embodiments of the invention can alternatively be fabricated in wafers comprising other materials, including but not limited to gallium arsenide (GaAs), indium phosphide (InP), etc.

FIGS. 1A and 1B are conceptual views of an illustrative spiral inductor 100 and an exemplary directed inductor 150, respectively, according to an embodiment of the present invention. With reference to FIG. 1A, a top plan view of the illustrative spiral inductor 100 is shown. The spiral inductor 100 may include a plurality of concentric conductive loops (i.e., coils) 102, 104, 106 and 108. Arrow 110 represents magnetic flux lines through a center of the inductor 100, and thus indicates an effective magnetic field intensity direction. Since the respective conductive loops 102, 104, 106, 108 share a common center, there will be a strong B-field concentrated in the center of the spiral inductor 100.

For clarification purposes, there are generally two quantities that physicists may refer to as the magnetic field, namely, H and B. Although the term "magnetic field" was historically reserved for H, with B being termed the "magnetic induction," B is now understood to be the more fundamental entity. The vector field H is known among electrical engineers as the magnetic field intensity or magnetic field strength, and is also known among physicists as auxiliary magnetic field or magnetizing field. The vector field B is known among electrical engineers as magnetic flux density or magnetic induction or simply magnetic field, as used by physicists.

As shown in FIG. 1A, dotted lines 112 and 114 represent individual flux lines of the respective conductive loops 102, 104, 106, 108 and shows the completion of the magnetic flux loops. Because the spiral inductor 100 orientation is symmetric when viewed top-down, spreading outward, radiated energy is transmitted substantially equally in all directions, thereby causing a high likelihood of interference with other adjacent vertically-oriented inductors.

With reference to FIG. 1B, a top plan view of the exemplary directed inductor (or antenna) 150 is shown. The directed inductor 150 preferably comprises a plurality of conductive loops 152, 154, 156, 158 and 160, each conductive loop being arranged so as to at least partially overlap an adjacent conductive loop along an arc, or an alternative path. As an illustrative analogy to the directed inductor 150, consider an inductor formed as a spring that has been spread out (e.g., in an arc or alternative line) and flattened. In contrast to the spiral inductor 100, where each conductive loop shares a common center, each of the respective conductive loops 152, 154, 156, 158, 160 of the directed inductor 150 will have its own B-field direction associated therewith. Arrow 162 represents the combined (resultant) magnetic flux lines through a center of the respective conductive loops 152, 154, 156, 158, 160, and thus indicates an effective magnetic field intensity direction of the directed inductor 150 traveling along the arc.

As shown in FIG. 1B, dotted line 164, which may be considered a magnetic flux return path, represents individual flux lines of the respective conductive loops 152, 154, 156, 158, 160 and shows the completion of the magnetic flux loops. As previously stated, since the spiral inductor orientation is symmetric when viewed top-down, the radiated energy is transmitted substantially equally in all directions. In the case of the directed inductor 150, however, the magnetic flux return path 164 is predominantly oriented to one side of the physical center of the inductor. An inductor formed in this manner beneficially allows two or more adjacent directed inductors to be placed so that the radiated magnetic waves are orthogonal to each other.

FIGS. 2A and 2B are top-down views depicting an exemplary spiral inductor 200 and a pair of exemplary directed inductors, 250 and 252, respectively, according to embodiments of the invention. As shown in FIG. 2A, spiral inductor 200, like the illustrative spiral inductor 100 depicted in FIG. 1A, has magnetic flux lines 202 emanating equally in all directions. Consequently, there is a high likelihood of interference with other adjacent inductors, as previously stated. In FIG. 2B, each of the pair of directed inductors 250, 252 includes two electrically conductive loops. Although each inductor is depicted having two conductive loops, the invention is not limited to any specific number of loops. Moreover, each of the directed inductors 250, 252 need not have the same number of loops.

More particularly, a first directed inductor 250 comprises a vertically-oriented first conductive loop 254 and a vertically-oriented second conductive loop 256 arranged having a center-line axis along a slanted line. Likewise, a second directed inductor 252 comprises a vertically-oriented first conductive loop 258 and a vertically-oriented second conductive loop 260 arranged having a center-line axis along a slanted line. First and second directed inductors 250, 252 have corresponding magnetic flux lines 262 and 266, respectively, that are predominantly oriented to one side of the physical centers of the inductors. The first and second directed inductors 250, 252 are preferably arranged relative to one another such that their respective magnetic flux lines are oriented orthogonal to one another, as indicated by the magnetic H fields 264 and 268 corresponding to the first and second directed inductors, respectively. As shown in the figure, the magnetic H fields 264 and 268 cancel each other out. While the pair of directed inductors 250, 252 are arranged, relative to one another, having orthogonally oriented magnetic flux lines, the invention is not limited to any particular magnetic field orientation.

FIG. 3 is a perspective view depicting an exemplary directed inductor 300, according to an embodiment of the invention. Directed inductor 300 may represent, for example, a side perspective view of one of the illustrative directed inductors 250 or 252 shown in FIG. 2B. Directed inductor 300 preferably comprises a plurality of conductive loops, 302, although the invention is not limited to any specific number of loops. The invention further contemplates a directed inductor implemented without any conductive loops (e.g., as a straight wire).

Arrow 304 represents the combined (resultant) magnetic flux lines through a center of the respective conductive loops 302, and thus indicates an effective magnetic field intensity direction of the directed inductor 300 for a given direction of current flowing through the conductive loops. Dotted arrows 306, which may be considered magnetic flux return paths, represent individual flux lines of the respective conductive loops 302 and show the completion of the magnetic flux loops. The magnetic flux return paths 306 for the directed inductor 300 are predominantly oriented to one side of the physical center of the inductor, and beneficially allow two or more adjacent directed inductors to be placed so that the radiated magnetic waves effectively cancel each other.

Figure 4:
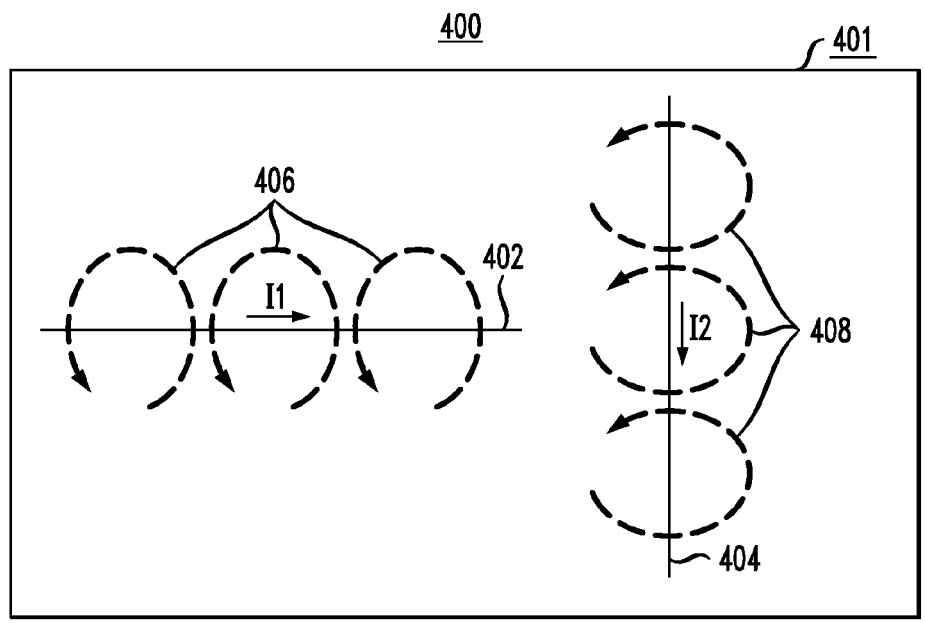
FIG. 4 is a conceptual view depicting an exemplary pair of directed inductors arranged so that radiated magnetic waves corresponding to each inductor effectively cancel out one another, according to an embodiment of the invention.

FIG. 4 is a conceptual view depicting an exemplary pair of directed inductors, 402 and 404, arranged so that radiated magnetic waves corresponding to each inductor effectively cancel out one another, according to an embodiment of the invention. As shown in the figure, the two directed inductors 402 and 404 are oriented substantially orthogonal to one another, although the invention is not limited to any particular angle of orientation between the inductors.

More particularly, an integrated circuit inductor structure 400 may comprise a first inductor element 402 formed on a semiconductor substrate 401 (e.g., silicon, gallium arsenide, etc.), the first inductor element having a first effective magnetic field direction (e.g., as represented by arrows 406) associated therewith, and at least a second inductor element 404 formed on the semiconductor substrate proximate the first inductor element, the second inductor element having a second effective magnetic field direction (e.g., as represented by arrows 408) associated therewith. The first and second inductor elements 402 and 404, respectively, are oriented relative to one another so as to create a non-zero angle between the first and second effective magnetic field directions. Although only two directed inductors are shown in FIG. 4, it is to be understood that more than two inductors may be utilized, in accordance with other aspects of the invention.

As apparent from FIG. 4, the pair of directed inductors 402, 404 may be implemented as simple wires. A current, I1, flowing through first directed inductor 402 will generate magnetic flux loops 406 directed into the page above the first inductor and out of the page below the first inductor, according to the right hand rule. Likewise, a current, I2, flowing through second directed inductor 404 will generate magnetic flux loops 408 directed into the page to the right of the second directed inductor and out of the page to the left of the second directed inductor. Preferably, the directed inductors are arranged so that the respective magnetic field directions of the inductors are substantially orthogonal relative to one another, although essentially non-zero angle between the magnetic field direction of each inductor is contemplated.

Figure 5:
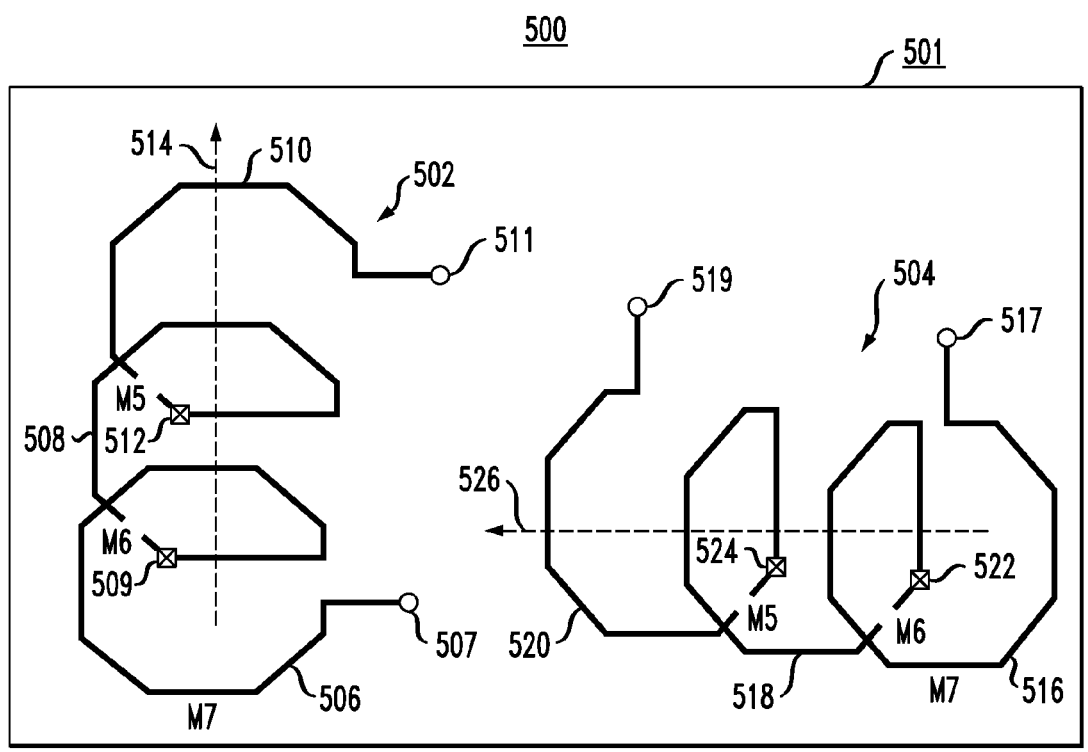
FIG. 5 is a top down view depicting an implementation of an exemplary integrated circuit inductor structure including at least first and second directed inductors, according to an embodiment of the present invention.

FIG. 5 is a top down view depicting an implementation of an exemplary integrated circuit inductor structure 500 including at least a first directed inductor 502 and a second directed inductor 504, according to an embodiment of the invention. As previously stated, the directed inductors are preferably formed on a substrate 501, such as, but not limited to, silicon. Different metal layers, or alternative conductive material layers, are preferably used to form the first and second directed inductors 502, 504, such that the respective directions of flux lines of the conductive loops (e.g., coils), as represented by arrows 514 and 526 (given a particular direction of current passing through each of the inductors), are oriented at a non-zero angle relative to one another, as previously explained.

As previously stated, the invention is not limited to any particular number of conductive loops fanning a given one of the inductor elements. It is to be understood that the term "conductive loop," as used herein, is intended to broadly refer to a conductor (e.g., trace, wire, etc.) that is substantially closed, in the sense that a starting point and an ending point of the loop is in substantially the same location (from a top plan view). Furthermore, although the conductive loops are depicted as being substantially circular, the shape of the conductive loops is not so limited; embodiments of the invention contemplate alternative shapes for the conductive loops, including square, rectangular, elliptical, trapezoidal, etc.

Specifically, first directed inductor 502 preferably comprises a plurality of conductive loops configured such that at least a portion of one loop overlaps an adjacent loop, as shown. For example, a first end of a first conductive loop 506 forms a first terminal 507 of the first directed inductor 502 and a second end of the first conductive loop is connected to a first end of a second conductive loop 508. A second end of the second conductive loop 508 is connected to a first end of a third conductive loop 510, and a second end of the third conductive loop forms a second terminal 511 of the first directed inductor 502.

First conductive loop 506 may be formed as a trace in a first metal layer, which may be a metal-7 (M7) layer. Second conductive loop 508 may be need as a trace in a second metal layer, which may be a metal-6 (M6) layer. Third conductive loop 510 may be formed as a trace in a third metal layer, which may be a metal-5 (M5) layer. Each of the traces forming the respective conductive loops 506, 508, 510 in the first directed inductor 502 are preferably formed using standard photolithographic techniques (e.g., patterning and etching). Electrical connection between two conductive layers can be made using one or more vias, or an alternative connection. For example, connection between the first conductive loop 506 and the second conductive loop 508 can be made using a first via 509, and electrical connection between the second conductive loop and the third conductive loop 510 can be made using a second via 512.

Likewise, the second directed inductor 504 preferably comprises a plurality of conductive loops, at least a portion of one loop overlapping an adjacent loop, as shown. For instance, a first end of a first conductive loop 516 forms a first terminal 517 of the second directed inductor 504 and a second end of the first conductive loop is connected to a first end of a second conductive loop 518. A second end of the second conductive loop 518 is connected to a first end of a third conductive loop 520, and a second end of the third conductive loop forms a second terminal 519 of the second directed inductor 504.

First conductive loop 516 may be formed as a trace in a first metal layer, which may be a metal-7 (M7) layer. Second conductive loop 518 may be formed as a trace in a second metal layer, which may be a metal-6 (M6) layer. Third conductive loop 520 may be formed as a trace in a third metal layer, which may be a metal-5 (M5) layer. Each of the traces forming the respective conductive loops 516, 518, 520 in the second directed inductor 504 are preferably formed using standard photolithographic techniques (e.g., patterning and etching). Electrical connection between two conductive layers can be made using one or more vias, or an alternative connection means. For example, connection between the first conductive loop 516 and the second conductive loop 518 can be made using a first via 522, and electrical connection between the second conductive loop and the third conductive loop 520 can be made using a second via 524.

It is to be appreciated that although the directed inductors 502, 504 are described using metal layers M7, M6 and M5, the invention is not limited to any particular metal layers. Moreover, the metal layers employed need not be adjacent metal layers. For example, first conductive loop 506 may be foamed in M7, second conductive loop 508 may be formed in M5, and third conductive loop 510 may be formed in M3, with via 509 connecting the M7 and M5 traces together, and via 512 connecting the M5 and M3 traces together, as will be understood by those skilled in the art given the teachings herein.

At least a portion of the techniques of the present invention may be implemented in one or more integrated circuits. In forming integrated circuits, die are typically fabricated in a repeated pattern on a surface of a semiconductor wafer. Each of the die includes a structure described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An integrated circuit in accordance with the present invention can be used in any application and/or electronic system which employ inductors. Suitable systems for implementing the invention may include, but are not limited to, communication systems (e.g., including a transmitter and/or receiver), portable communications devices (e.g., cell phones), signal processing systems (e.g., filters), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An integrated circuit inductor structure, comprising:
    a first inductor element formed on a semiconductor substrate, the first inductor element having a first effective magnetic field direction associated therewith; and
    at least a second inductor element formed on the semiconductor substrate proximate the first inductor element, the second inductor element having a second effective magnetic field direction associated therewith, the first and second inductor elements being oriented relative to one another so as to create a non-zero angle between the first and second effective magnetic field directions;
    wherein at least one of the first and second inductor elements comprises a plurality of conductive loops in which a first conductive loop partially but not completely overlaps at least a second conductive loop.

2. The inductor structure of claim 1, wherein the angle between the first and second effective magnetic field directions is substantially equal to ninety degrees.

3. The inductor structure of claim 1, wherein each of the first and second inductor elements comprises one or more individual turns on a same inductor structure.

4. The inductor structure of claim 1, wherein each of the first and second inductor elements comprises a spiral inductor having a directed magnetic field.

5. The inductor structure of claim 1, wherein centers of respective ones of the plurality of conductive loops are arranged along an arc.

6. The inductor structure of claim 1, wherein centers of respective ones of the plurality of conductive loops are arranged along a line slanted relative to the respective ones of the plurality of conductive loops.

7. The inductor structure of claim 1, wherein any two adjacent conductive loops in the at least one inductor element are formed in different respective conductive layers in the integrated circuit.

8. The inductor structure of claim 1, wherein the conductive loops in the at least one inductor element are substantially circular.

9. The inductor structure of claim 1, wherein each of the first and second inductor elements is vertically oriented.

10. The inductor structure of claim 1, wherein the first conductive loop and the second conductive loop are of different sizes.

11. The inductor structure of claim 10, wherein the first conductive loop and the second conductive loop are concentric.

12. The inductor structure of claim 1, wherein the first conductive loop and the second conductive loop are not concentric.

13. The inductor structure of claim 12, wherein the first conductive loop and the second conductive loop are of substantially equal size.

14. An electronic system, comprising:
    at least one integrated circuit including at least one inductor structure, the at least one inductor structure comprising:
    a first inductor element formed on a semiconductor substrate, the first inductor element having a first effective magnetic field direction associated therewith; and
    at least a second inductor element formed on the semiconductor substrate proximate the first inductor element, the second inductor element having a second effective magnetic field direction associated therewith, the first and second inductor elements being oriented relative to one another so as to create a non-zero angle between the first and second effective magnetic field directions;
    wherein at least one of the first and second inductor elements comprises a plurality of conductive loops in which a first conductive loop partially but not completely overlaps at least a second conductive loop.

15. The system of claim 14, wherein each of the first and second inductor elements comprises one or more individual turns on a same inductor structure.

16. The system of claim 14, wherein each of the first and second inductor elements comprises a spiral inductor having a directed magnetic field.

17. The system of claim 14, wherein centers of respective ones of the plurality of conductive loops are arranged along an arc.

18. The system of claim 14, wherein centers of respective ones of the plurality of conductive loops are arranged along a line slanted relative to the respective ones of the plurality of conductive loops.

19. The system of claim 14, wherein the conductive loops in the at least one inductor element are substantially circular.

20. A method of reducing magnetic coupling between at least two integrated circuit inductors, the method comprising the steps of:
    forming a first inductor element on a semiconductor substrate, the first inductor element having a first effective magnetic field direction associated therewith; and
    forming at least a second inductor element on the semiconductor substrate proximate the first inductor element, the second inductor element having a second effective magnetic field direction associated therewith, the first and second inductor elements being oriented relative to one another so as to create a non-zero angle between the first and second effective magnetic field directions;
    wherein at least one of the first and second inductor elements comprises a plurality of conductive loops in which a first conductive loop partially but not completely overlaps at least a second conductive loop.

* * * * *